(12) United States Patent
Perera

(10) Patent No.: US 8,871,598 B1
(45) Date of Patent: Oct. 28, 2014

(54) NON-VOLATILE MEMORY (NVM) AND HIGH-K AND METAL GATE INTEGRATION USING GATE-FIRST METHODOLOGY

(71) Applicant: Asanga H. Perera, West Lake Hills, TX (US)

(72) Inventor: Asanga H. Perera, West Lake Hills, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/955,665

(22) Filed: Jul. 31, 2013

(51) Int. Cl.
 *H01L 21/336* (2006.01)
 *H01L 29/66* (2006.01)
 *H01L 21/28* (2006.01)

(52) U.S. Cl.
 CPC ........ *H01L 29/665* (2013.01); *H01L 21/28008* (2013.01)
 USPC ............. 438/299; 257/E21.422; 257/E21.423

(58) Field of Classification Search
 USPC ....................................................... 438/299
 See application file for complete search history.

(56) References Cited

U.S. PATENT DOCUMENTS

| | | | |
|---|---|---|---|
| 5,614,746 A | 3/1997 | Hong et al. |
| 6,087,225 A | 7/2000 | Bronner et al. |
| 6,194,301 B1 | 2/2001 | Radens et al. |
| 6,235,574 B1 | 5/2001 | Tobben et al. |
| 6,333,223 B1 | 12/2001 | Moriwaki et al. |
| 6,388,294 B1 | 5/2002 | Radens et al. |
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |
| 6,777,761 B2 | 8/2004 | Clevenger et al. |
| 6,785,165 B2 | 8/2004 | Kawahara et al. |
| 6,939,767 B2 | 9/2005 | Hoefler et al. |
| 7,154,779 B2 | 12/2006 | Mokhlesi et al. |
| 7,183,159 B2 | 2/2007 | Rao et al. |
| 7,190,022 B2 | 3/2007 | Shum et al. |
| 7,202,524 B2 | 4/2007 | Kim et al. |
| 7,208,793 B2 | 4/2007 | Bhattacharyya |

(Continued)

FOREIGN PATENT DOCUMENTS

WO    2009058486    5/2009

OTHER PUBLICATIONS

Office Action—Allowance mailed Feb. 21, 2014 in U.S. Appl. No. 13/441,426.

(Continued)

*Primary Examiner* — Asok K Sarkar
*Assistant Examiner* — Igwe U Anya
(74) *Attorney, Agent, or Firm* — James L. Clingan, Jr.; Mary Jo Bertani

(57) ABSTRACT

A method of making a semiconductor device includes forming a split gate memory gate structure on a memory region of a substrate, and protecting the split gate memory gate structure by depositing protective layers over the memory region including the memory gate structure and over a logic region of the substrate. The protective layers include a material that creates a barrier to diffusion of metal. The protective layers are retained over the memory region while forming a logic gate in the logic region. The logic gate includes a high-k dielectric layer and a metal layer. A spacer material is deposited over the logic gate. Spacers are formed on the memory gate structure and the logic gate. The spacer on the logic gate is formed of the spacer material and the spacer on the memory gate structure is formed with one of the protective layers.

20 Claims, 10 Drawing Sheets

(56) References Cited

U.S. PATENT DOCUMENTS

| | | | |
|---|---|---|---|
| 7,256,125 B2 | 8/2007 | Yamada et al. | |
| 7,271,050 B2 | 9/2007 | Hill | |
| 7,365,389 B1 | 4/2008 | Jeon et al. | |
| 7,391,075 B2 | 6/2008 | Jeon et al. | |
| 7,402,493 B2 | 7/2008 | Oh et al. | |
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,521,314 B2 | 4/2009 | Jawarani et al. | |
| 7,524,719 B2 | 4/2009 | Steimle et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,795,091 B2 | 9/2010 | Winstead et al. | |
| 7,799,650 B2 | 9/2010 | Bo et al. | |
| 7,816,727 B2 | 10/2010 | Lai et al. | |
| 7,821,055 B2 | 10/2010 | Loiko et al. | |
| 7,906,396 B1 | 3/2011 | Chiang et al. | |
| 7,932,146 B2 | 4/2011 | Chen et al. | |
| 7,989,871 B2 | 8/2011 | Yasuda | |
| 7,999,304 B2 | 8/2011 | Ozawa et al. | |
| 8,017,991 B2 | 9/2011 | Kim et al. | |
| 8,043,951 B2 | 10/2011 | Beugin et al. | |
| 8,063,434 B1 | 11/2011 | Polishchuk et al. | |
| 8,093,128 B2 | 1/2012 | Koutny et al. | |
| 8,138,037 B2 | 3/2012 | Chudzik et al. | |
| 8,168,493 B2 | 5/2012 | Kim | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1 | 9/2013 | Hall et al. | |
| 8,536,006 B2 | 9/2013 | Shroff et al. | |
| 8,536,007 B2 | 9/2013 | Shroff et al. | |
| 8,679,927 B2 | 3/2014 | Ramkumar et al. | |
| 2001/0049166 A1 | 12/2001 | Peschiaroli et al. | |
| 2002/0061616 A1 | 5/2002 | Kim et al. | |
| 2003/0022434 A1 | 1/2003 | Taniguchi et al. | |
| 2004/0075133 A1 | 4/2004 | Nakagawa et al. | |
| 2004/0262670 A1 | 12/2004 | Takebuchi et al. | |
| 2005/0145949 A1 | 7/2005 | Sadra et al. | |
| 2006/0038240 A1 | 2/2006 | Tsutsumi et al. | |
| 2006/0046449 A1 | 3/2006 | Liaw | |
| 2006/0099798 A1 | 5/2006 | Nakagawa | |
| 2006/0134864 A1 | 6/2006 | Higashitani et al. | |
| 2006/0211206 A1 | 9/2006 | Rao et al. | |
| 2006/0221688 A1 | 10/2006 | Shukuri et al. | |
| 2007/0037343 A1 | 2/2007 | Colombo et al. | |
| 2007/0077705 A1 | 4/2007 | Prinz et al. | |
| 2007/0115725 A1 | 5/2007 | Pham et al. | |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0029805 A1* | 2/2008 | Shimamoto et al. | 257/315 |
| 2008/0050875 A1 | 2/2008 | Moon et al. | |
| 2008/0067599 A1 | 3/2008 | Tsutsumi et al. | |
| 2008/0105945 A1 | 5/2008 | Steimle et al. | |
| 2008/0121983 A1 | 5/2008 | Seong et al. | |
| 2008/0128785 A1 | 6/2008 | Park et al. | |
| 2008/0145985 A1 | 6/2008 | Chi | |
| 2008/0185635 A1 | 8/2008 | Yanagi et al. | |
| 2008/0237690 A1 | 10/2008 | Anezaki et al. | |
| 2008/0237700 A1 | 10/2008 | Kim et al. | |
| 2008/0283900 A1 | 11/2008 | Nakagawa et al. | |
| 2008/0290385 A1 | 11/2008 | Urushido | |
| 2008/0308876 A1 | 12/2008 | Lee et al. | |
| 2009/0050955 A1 | 2/2009 | Akita et al. | |
| 2009/0065845 A1 | 3/2009 | Kim et al. | |
| 2009/0072274 A1* | 3/2009 | Knoefler et al. | 257/204 |
| 2009/0078986 A1 | 3/2009 | Bach | |
| 2009/0101961 A1 | 4/2009 | He et al. | |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0269893 A1 | 10/2009 | Hashimoto et al. | |
| 2009/0273013 A1 | 11/2009 | Winstead et al. | |
| 2009/0278187 A1 | 11/2009 | Toba | |
| 2011/0031548 A1 | 2/2011 | White et al. | |
| 2011/0095348 A1 | 4/2011 | Chakihara et al. | |
| 2011/0204450 A1 | 8/2011 | Moriya | |
| 2011/0260258 A1 | 10/2011 | Zhu et al. | |
| 2012/0034751 A1 | 2/2012 | Ariyoshi et al. | |
| 2012/0104483 A1* | 5/2012 | Shroff et al. | 257/324 |
| 2012/0132978 A1 | 5/2012 | Toba et al. | |
| 2012/0142153 A1* | 6/2012 | Jeong | 438/264 |
| 2012/0248523 A1 | 10/2012 | Shroff et al. | |
| 2012/0252171 A1 | 10/2012 | Shroff et al. | |
| 2013/0026553 A1 | 1/2013 | Horch | |
| 2013/0037886 A1 | 2/2013 | Tsai et al. | |
| 2013/0065366 A1 | 3/2013 | Thomas et al. | |
| 2013/0084684 A1 | 4/2013 | Ishii et al. | |
| 2013/0137227 A1* | 5/2013 | Shroff et al. | 438/216 |
| 2013/0171785 A1 | 7/2013 | Shroff et al. | |
| 2013/0171786 A1 | 7/2013 | Shroff et al. | |
| 2013/0178027 A1 | 7/2013 | Hall et al. | |
| 2013/0178054 A1* | 7/2013 | Shroff et al. | 438/591 |
| 2013/0264633 A1 | 10/2013 | Hall et al. | |
| 2013/0264634 A1 | 10/2013 | Hall et al. | |
| 2013/0267074 A1 | 10/2013 | Hall et al. | |
| 2013/0323922 A1 | 12/2013 | Shen et al. | |
| 2014/0035027 A1 | 2/2014 | Chakihara et al. | |
| 2014/0050029 A1 | 2/2014 | Kang et al. | |
| 2014/0120713 A1 | 5/2014 | Shroff et al. | |

OTHER PUBLICATIONS

Office Action—Allowance mailed Feb. 28, 2014 in U.S. Appl. No. 13/442,142.

Office Action—Allowance mailed Mar. 3, 2014 in U.S. Appl. No. 13/790,014.

Office Action—Allowance mailed Mar. 6, 2014 in U.S. Appl. No. 13/491,771.

Office Action—Allowance mailed Mar. 11, 2014 in U.S. Appl. No. 13/907,491.

Office Action—Allowance mailed Mar. 12, 2014 for U.S. Appl. No. 13/790,225.

Chen, J.H., et al., "Nonvolatile Flash Memory Device Using Ge Nanocrystals Embedded in HfA1O High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAlO—SiO2 tunnel layer", Sciencedirect. com, Solid-State Electronics, vol. 61, Issue 1, Jul. 2011, pp. 100-105, http://wwww.sciencedirect.com/science/article/pii/S0038110111000803.

Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielec-

(56) References Cited

OTHER PUBLICATIONS tric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.

U.S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.

U.S. Appl. No. 13/442,142, Hall, M.D., et al., "Logic Transistor and Non-Volatile Memory Cell Integration", Office Action—Ex Parte Quayle, Apr. 4, 2013.

U.S. Appl. No. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 13, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Rejection, Aug. 22, 2013.

U.S. Appl. No. 13/077,491, Shroff, M.., et al., "Non-Volatile Memory and Logic Circuit Process Integration", Office Action—Rejection, Aug. 15, 2012.

U.S. Appl. No. 13/077,491, Shroff, M.., et al., "Non-Volatile Memory and Logic Circuit Process Integration", Office Action—Rejection, Feb. 6, 2013.

U.S. Appl. No. 13/077,491, Shroff, M.., et al., "Non-Volatile Memory and Logic Circuit Process Integration", Office Action—Allowance, Jun. 18, 2013.

U.S. Appl. No. 13/077,501, Shroff, M.., et al., "Non-Volatile Memory and Logic Circuit Process Integration", Office Action—Allowance, Nov. 26, 2012.

U.S. Appl. No. 13/313,179, Shroff, M., et al., "Method of Protecting Against via Failure and Structure Therefor", Office Action—Rejection, Aug. 15, 2013.

U.S. Appl. No. 13/307,719, Shroff, M., et al., "Logic and Non-Volatile Memory (NVM) Integration", Office Action—Allowance, May 29, 2013.

U.S. Appl. No. 13/343,331, Shroff, M., et al., "Non-Volatile Memory (NVM) and Logic Integration", Office Action—Rejection, Mar. 13, 2013.

U.S. Appl. No. 13/343,331, Shroff, M., et al., "Non-Volatile Memory (NVM) and Logic Integration", Office Action—Allowance, Jun. 24, 2013.

U.S. Appl. No. 13/441,426, Shroff, M., et al., "Non-Volatile Memory (NVM) and Logic Integration", Office Action—Allowance, Sep. 9, 2013.

U.S. Appl. 13/780,574, Hall, M.D., et al., Non-Volatile Memory (NVM) and Logic Integration, Office Action—Allowance, Sep. 6, 2013.

U.S. Appl. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.

U.S. Appl. No. 13/491,771, Hall, M., et al., "Integrating Formation of a Replacement Gate Transistor and a Non-Volatile Memory Cell Using a High-K Dielectric", filed Jun. 8, 2012.

U.S. Appl. No. 13/790,225, Hall, M., et al., "Integrating Formation of a Replacement Gate Transistor and a non-Volatile Memory Cell Having Thin Film Storage", filed Mar. 8, 2013.

U.S. Appl. No. 13/790,014, Hall, M., et al., "Integrating Formation of a Logic Transistor and a None-Volatile Memory Cell Using a Partial Replacement Gate Technique", filed Mar. 8, 2013.

U.S. Appl. No. 13/955,665, Perera, a.H., "Non-Volatile Memory (NVM) and High K and Metal Gate Integration Using Gate First Methodology", filed Jul. 31, 2013.

U.S. Appl. No. 13/928,666, Hong, C. M., et al., "Non-Volatile Memory (NVM) and High Voltage Transistor Integration", filed Jun. 27, 2013.

U.S. Appl. No. 13/780,591, Hall, M.D., et al., "Non-Volatile Memory (NVM) and Logic Integration", filed Feb. 28, 2013.

U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.

U.S. Appl. No. 13/661,157, Shroff, M.D., et al., "Method of Making a Logic Transistor and a Non-Volatile Memory (NVM) Cell", file Oct. 26, 2012.

U.S. Appl. No. 13/781,727, Shroff, M., et al., "Methods of Making Logic Transistors and non-Volatile Memory Cells", Office Action—Restriction, Jun. 21, 2013.

Office Action mailed Nov. 22, 2013 in U.S. Appl. No. 13/780,591.
Office Action mailed Jan. 31, 2014 in U.S. Appl. No. 13/781,727.
Office Action mailed Dec. 24, 2013 in U.S. Appl. No. 13/790,225.
Office Action mailed Dec. 24, 2013 in U.S. Appl. No. 13/790,014.
Office Action mailed Dec. 31, 2013 in U.S. Appl. No. 13/442,142.
Office Action mailed Jan. 16, 2014 in U.S. Appl. No. 13/491,771.
U.S. Appl. No. 13/781,727, Office Action—Allowance, May 12, 2014.

U.S. Appl. 13/441,426, Shroff, M. D., et al., Office Action—Allowance, mailed Jun. 9, 2014.

U.S. Appl. No. 13/907,491, Office Action—Rejection, Sep. 3, 2013.
U.S. Appl. No. 13/343,331, Office Action—Allowance, Nov. 8, 2013.
U.S. Appl. No. 13/928,666, Hong, Office Action—Rejection, mailed Jul. 23, 2014.

U.S. Appl. No. 14/041,662, Perera, Office Action—Restriction, mailed Aug. 1, 2014.

U.S. Appl. No. 13/969,180, Perera, Office Action—Allowance, mailed Aug. 5, 2014.

U.S. Appl. No. 13/781727, Shroff, Office Action—Allowance, mailed Aug. 15, 2014.

U.S. Appl. No. 13/973,549, Hong, Office Action—Restriction, mailed Aug. 26, 2014.

* cited by examiner

US 8,871,598 B1

NON-VOLATILE MEMORY (NVM) AND HIGH-K AND METAL GATE INTEGRATION USING GATE-FIRST METHODOLOGY

BACKGROUND

1. Field

This disclosure relates generally to non-volatile memories (NVMs) and logic transistors, and more particularly, integrating NVMs with logic transistors that have high-k gate dielectrics and metal gates using a gate-first methodology.

2. Related Art

The integration of non-volatile memories (NVMs) with logic transistors has always been a challenge due to the different requirements for the NVM transistors, which store charge, and the logic transistors which are commonly intended for high speed operation. The need for storing charge has been addressed mostly with the use of floating gates but also with nanocrystals or nitride. In any of these cases, the need for this unique layer makes integration of the NVM transistors and the logic transistors difficult. The particular type of charge storage layer can also have a large effect on the options that are available in achieving the integration.

Accordingly there is a need to provide an integration that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell in a NVM portion of an integrated circuit and a logic transistor in a logic portion of the integrated circuit includes forming the gate structure of the NVM cell in the NVM portion, including the charge storage layer, while masking the logic portion. The logic gate is formed while masking the NVM portion with a hard mask that is subsequently used to form sidewall spacers in the NVM portion. Source/drain implants are performed simultaneously in the NVM and logic portions. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

Figure 1:
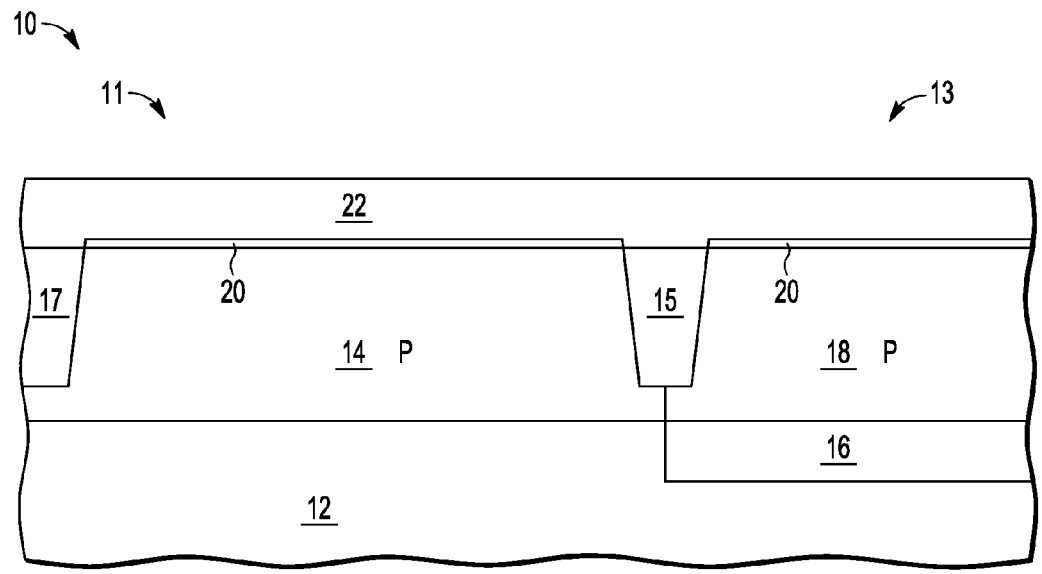
FIG. 1 is a cross section of a semiconductor structure having a non-volatile memory (NVM) structure and a logic transistor structure at a stage in processing according to an embodiment.

Shown in FIG. 1 is a semiconductor structure 10 of an integrated circuit having an NVM portion 11 and a logic portion 13. Semiconductor structure 10 has a substrate 12, an isolation region 15 separating logic portion 13 from NVM portion 11, an isolation region 17 in NVM portion 11 that, along with isolation region 15, that defines borders of an active region in NVM portion 11, a P well 14 in substrate 12 in the NVM portion extending from the surface of substrate 12, a P well 18 in logic portion 13 that extends from the surface of substrate 12, an N region 16 below P well 18 for aiding in providing noise isolation for the logic transistors, an oxide layer 20 on the top surface of substrate 12 in NVM portion 11 and logic portion 13. Oxide layer 20 is a thermal oxide that is grown, rather than deposited, for high quality. Over oxide layer 20 and isolation regions 15 and 17 is a polysilicon layer 22 that may be doped in situ or by implant. N wells are also formed in other portions of logic portion 13, which are not shown, for the forming P channel transistors.

Figure 2:
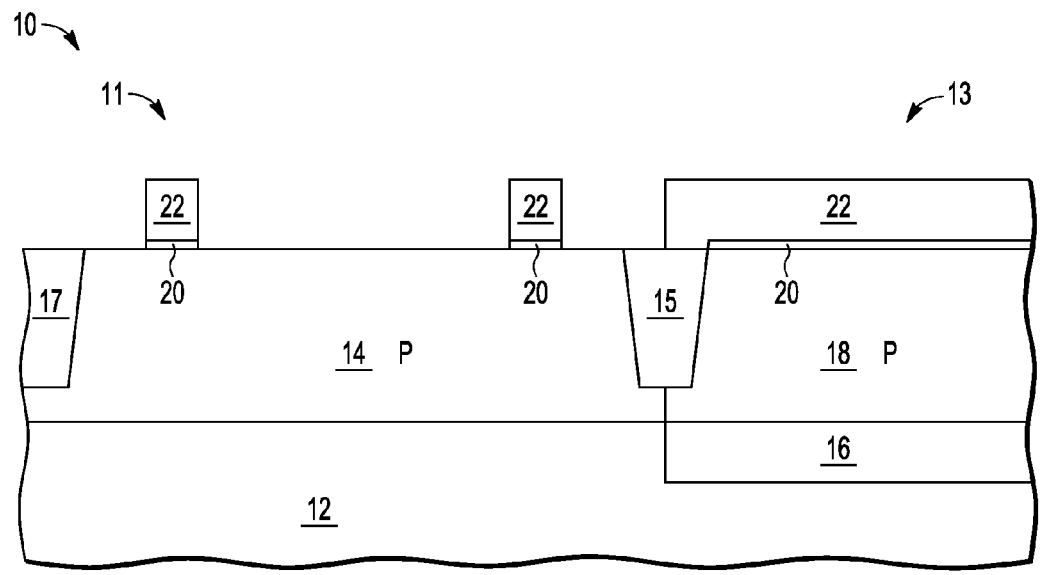
FIG. 2 is a cross section of the semiconductor structure of FIG. 1 at a subsequent stage in processing.

Shown in FIG. 2 is semiconductor structure 10 after patterning polysilicon layer 22 and oxide layer 20 in NVM portion 11 to form select gate structures. Patterning is typically achieved using patterned photoresist.

Figure 3:
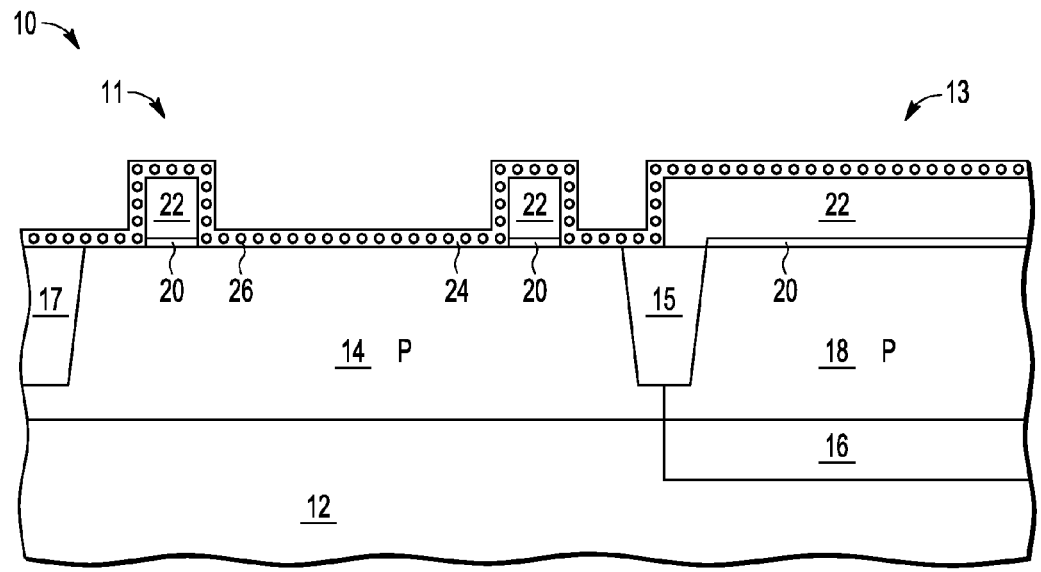
FIG. 3 is a cross section of the semiconductor structure of FIG. 2 at a subsequent stage in processing.

Shown in FIG. 3 is semiconductor structure 10 after forming a charge storage layer 24 having nanocrystals such as nanocrystal 26. Nanocrystal layer is preferably formed by first growing a thermal oxide layer on the exposed top surface of substrate 12 and on the exposed surfaces of polysilicon layer 22. This oxide grown on the top surface of substrate 12 is of particular importance because that is where charge will pass during program and erase. The nanocrystals are formed on the grown oxide and a deposited oxide is formed on and around the nanocrystals.

Figure 4:
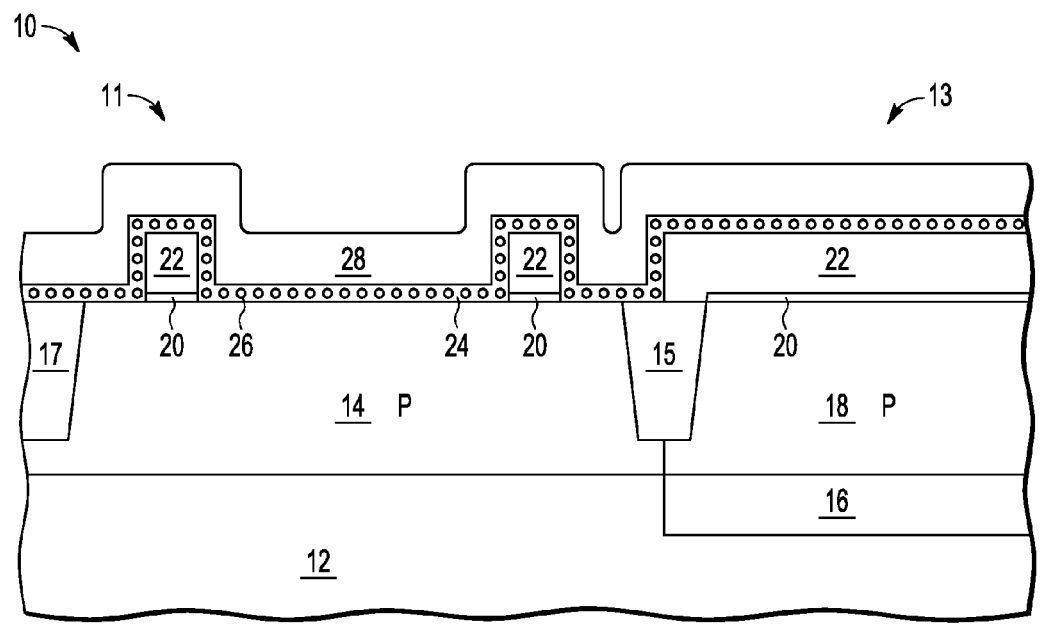
FIG. 4 is a cross section of the semiconductor structure of FIG. 3 at a subsequent stage in processing.

Shown in FIG. 4 is semiconductor structure 10 after depositing a polysilicon layer 28 on nanocrystal layer 24. This polysilicon layer is made conductive by doping which may be in situ or by implant.

Figure 5:
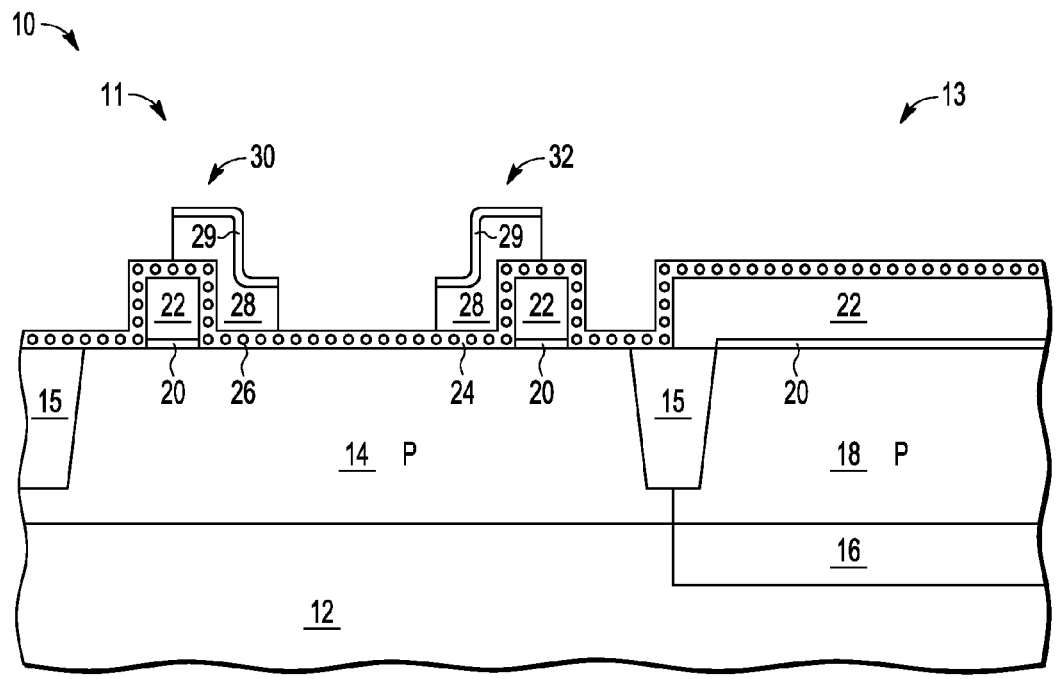
FIG. 5 is a cross section of the semiconductor structure of FIG. 4 at a subsequent stage in processing.

Shown in FIG. 5 is semiconductor structure 10 after an oxide layer 29 is formed on polysilicon layer 28, a patterned photoresist layer is formed on oxide layer 29, and a patterned etch of polysilicon layer 28 is performed that results in NVM gate structures 30 and 32. For NVM gate structure 30, the portion of polysilicon layer 22 is the select gate and the portion of polysilicon layer 28 is the control gate in which a portion of the control gate is over a portion of the select gate and over a portion of the substrate adjacent to a side of the select gate facing NVM gate structure 32. For NVM gate structure 32, the portion of polysilicon layer 22 is the select gate and the portion of polysilicon layer 28 is the control gate in which a portion of the select gate is over a portion of the control gate and over a portion of the substrate adjacent to a side of the select gate facing NVM gate structure 30. Charge storage layer 24 is between the select gate and control gate of NVM gate structure 30 and between the select gate and control gate of NVM gate structure 32.

Figure 6:
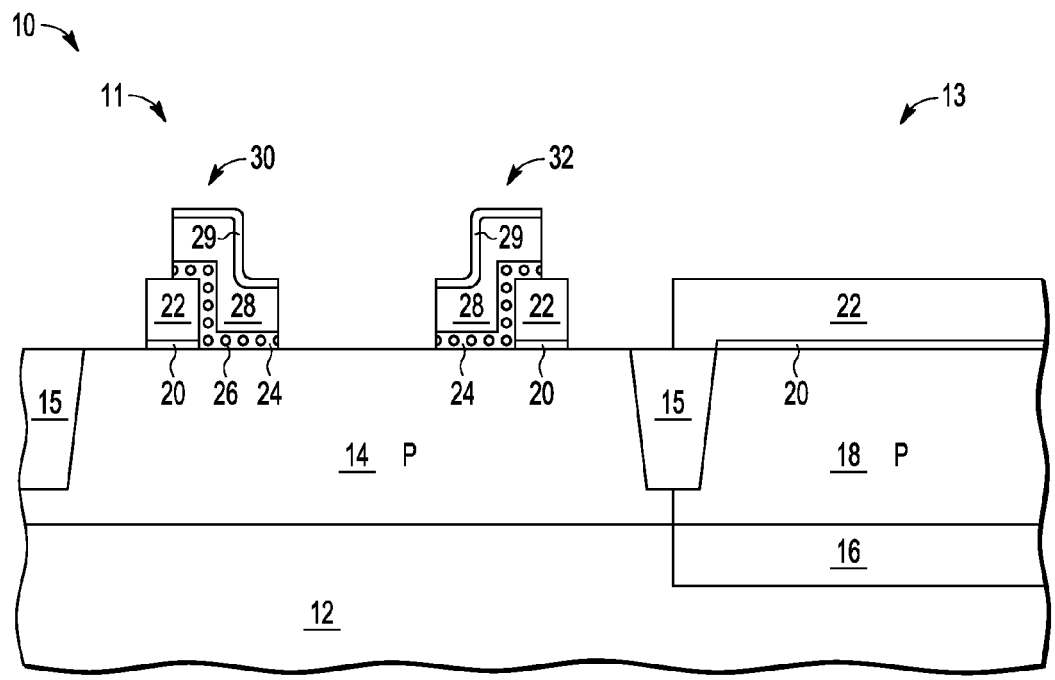
FIG. 6 is a cross section of the semiconductor structure of FIG. 5 at a subsequent stage in processing.

Shown in FIG. 6 is semiconductor structure 10 after removing charge storage layer 24 from over substrate 12 and logic portion 13 and leaving charge storage layer under the control gates and between the select gates and control gates.

Figure 7:
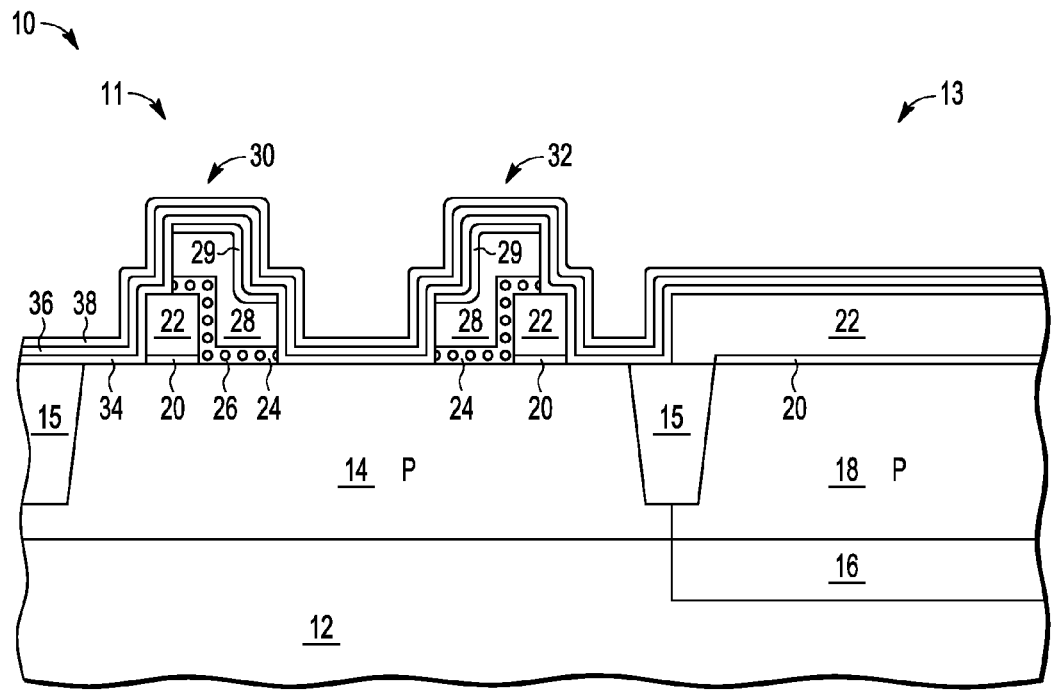
FIG. 7 is a cross section of a semiconductor structure at a stage in processing according to a second embodiment.

Shown in FIG. 7 is semiconductor structure 10 after depositing an oxide layer 34, a nitride layer 36 on oxide layer 34, and an oxide layer 38 on nitride layer 36. Oxide layer 34 provides protection for the polysilicon from nitride layer 36.

Figure 8:
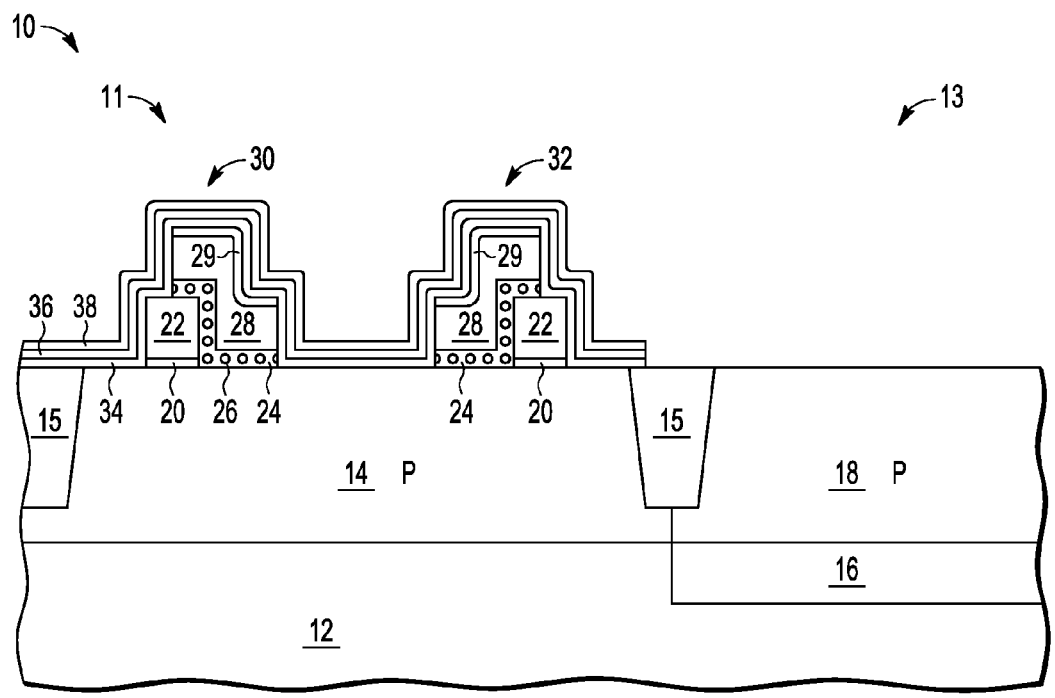
FIG. 8 is a cross section of the semiconductor structure of FIG. 7 at a subsequent stage in processing.

Shown in FIG. 8 is semiconductor structure 10 after removing oxide layer 34, nitride layer 36, and oxide layer 38 from logic portion 13. The remaining portion of oxide layer 34, nitride layer 36, and oxide layer 38 over NVM portion functions as a hard mask.

Figure 9:
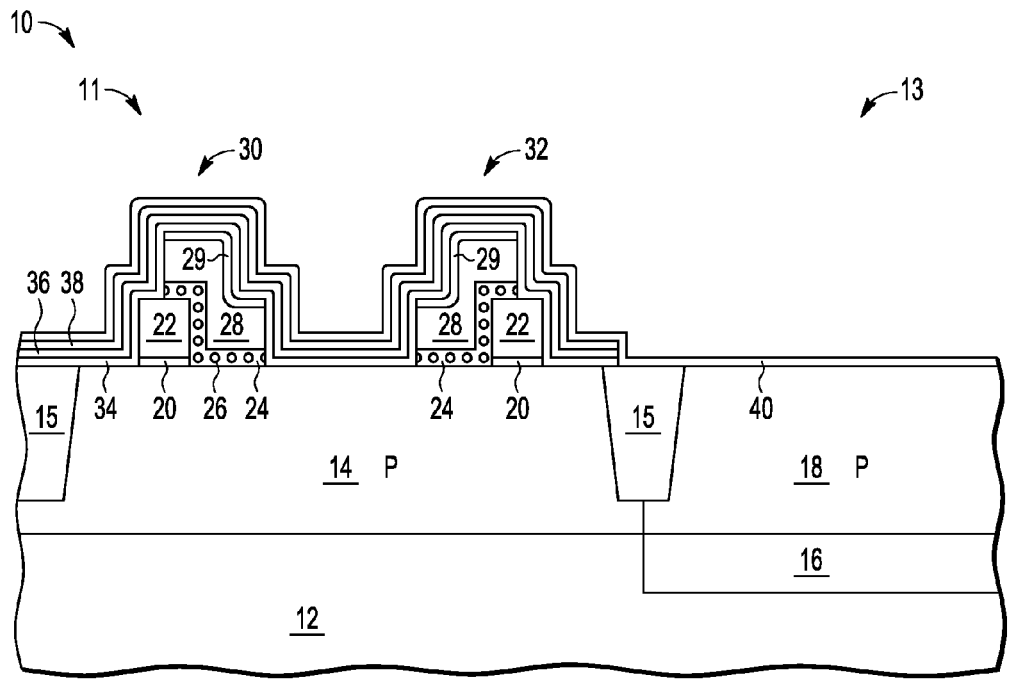
FIG. 9 is a cross section of the semiconductor structure of FIG. 8 at a subsequent stage in processing.

Shown in FIG. 9 is semiconductor structure 10 after forming a layer of high-k dielectric 40 on substrate 12 in logic portion 13 and over the hard mask of oxide layer 34, nitride layer 36, and oxide layer 38 in NVM portion 11. After forming high-k dielectric 40 a work function metal is formed over the N wells in logic portion 13 for setting the work function of P channel transistors. This work function metal is removed from the P wells such as P well 18 and from NVM portion 11.

Figure 10:
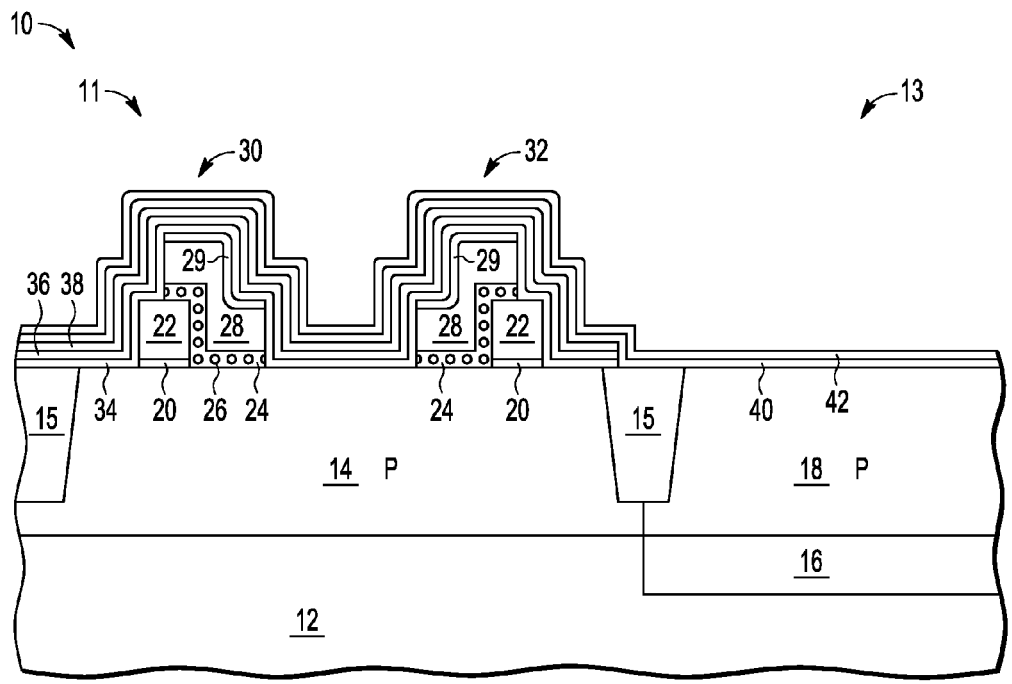
FIG. 10 is a cross section of the semiconductor structure of FIG. 9 at a subsequent stage in processing.

Shown in FIG. 10 is semiconductor structure 10 after depositing a metal 42 that functions as a barrier metal, a work function metal for the P wells such as P well 18, and for providing a highly conductive gate conductor for both the N and P channel transistors.

Figure 11:
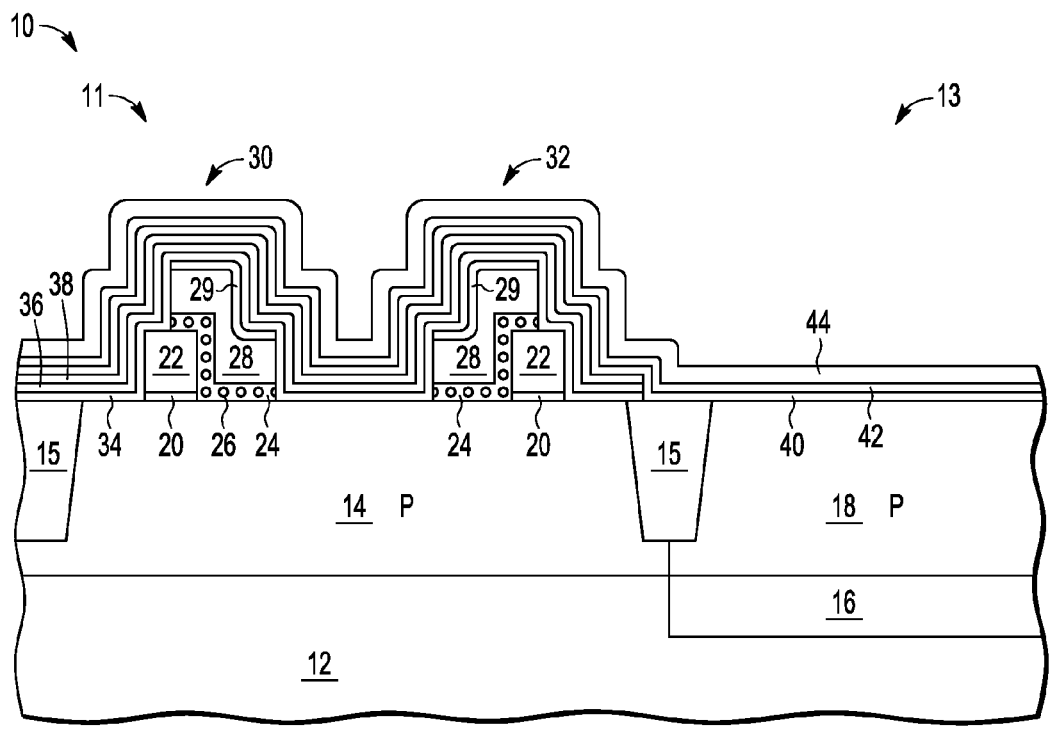
FIG. 11 is a cross section of the semiconductor structure of FIG. 10 at a subsequent stage in processing.

Shown in FIG. 11 is semiconductor structure 10 after depositing a polysilicon layer 44 over metal 42.

Figure 12:
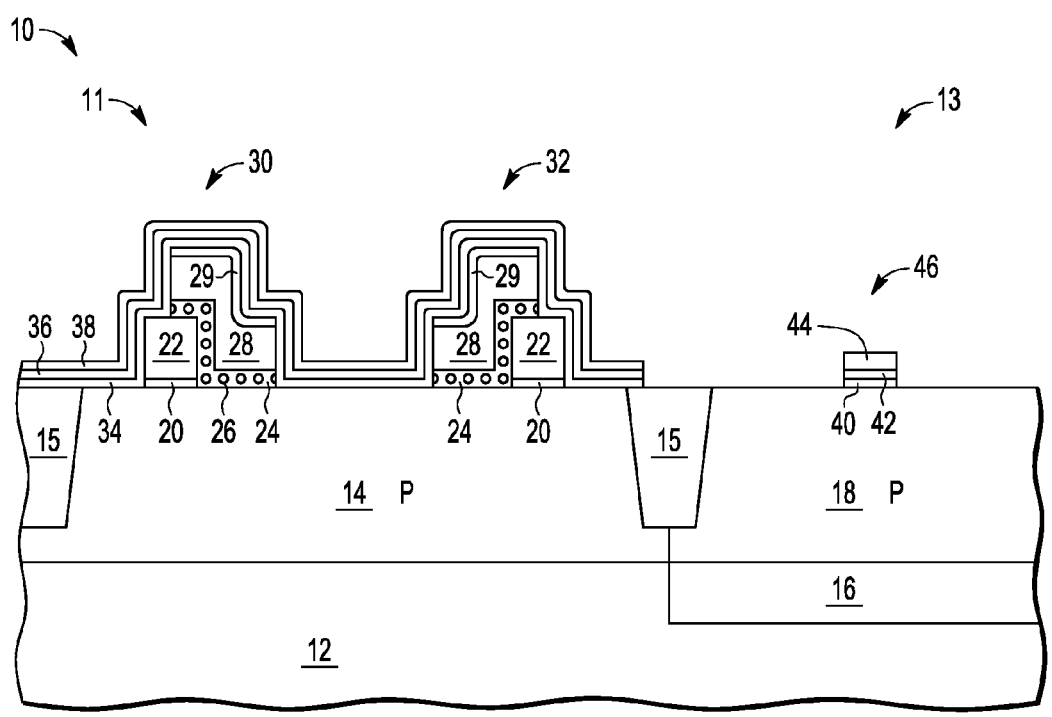
FIG. 12 is a cross section of the semiconductor structure of FIG. 11 at a subsequent stage in processing.

Shown in FIG. 12 is semiconductor structure 10 after selectively etching polysilicon layer 44, metal 42, and high-k dielectric 40 in logic portion 13 to leave a logic gate 46 in logic portion 13. In addition to polysilicon layer 44, metal 42, and high-k dielectric 40 being removed from NVM portion 11, oxide layer 38 is also removed from NVM portion 11. The etch of metal 42 has the effect of metal making contact with NVM portion 11 which can be a contaminant to charge storage layer 24, especially since charge storage layer 24 has nanocrystals. The hard mask formed by oxide layer 34 and nitride layer 36 prevents this from occurring. Oxide layer 38 is removed by the etchants used in the etching of metal 42.

Figure 13:
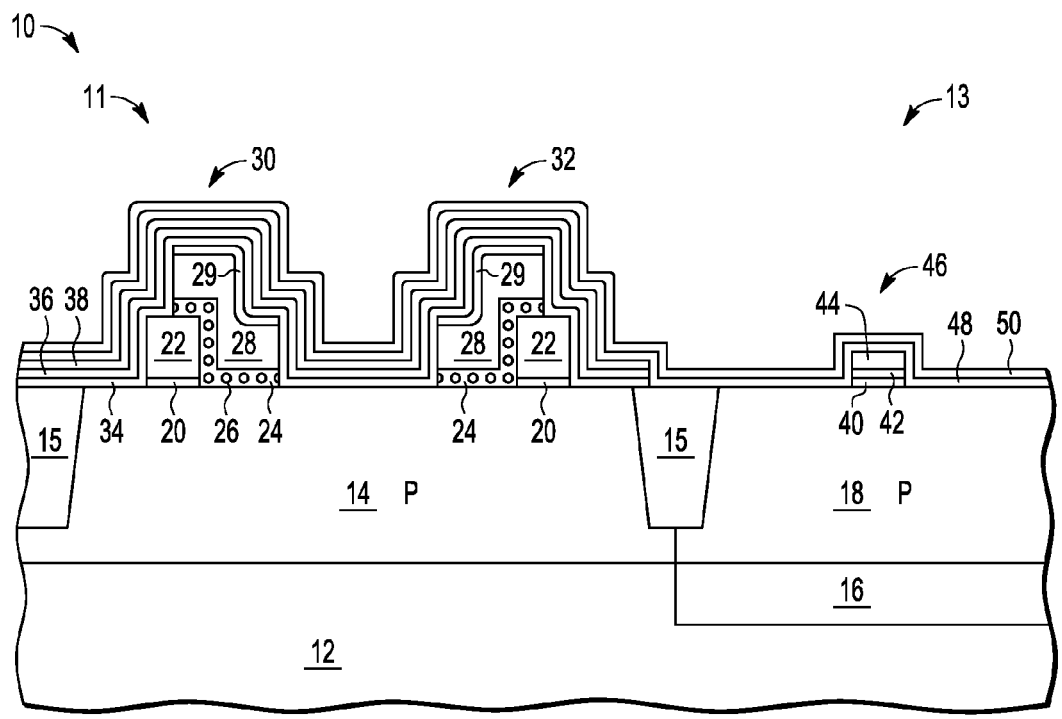
FIG. 13 is a cross section of the semiconductor structure of FIG. 12 at a subsequent stage in processing.

Shown in FIG. 13 is semiconductor structure 10 after depositing a nitride layer 48 and an oxide layer 50 on nitride layer 48. In NVM portion 11, nitride layer 48 is on nitride layer 36. There is then an oxide-nitride-oxide layer of oxide layer 34, nitride layers 36 and 48, and oxide layer 50 in NVM portion 11. In logic portion 13, nitride layer 48 is on substrate 12, although a thin native oxide layer may be between substrate 12 and nitride layer 48, and on logic gate structure 46. Oxide layer 50 is on nitride layer 48. Oxide layers 34 and 50 and nitride layers 36 and 48 are conformal.

Figure 14:
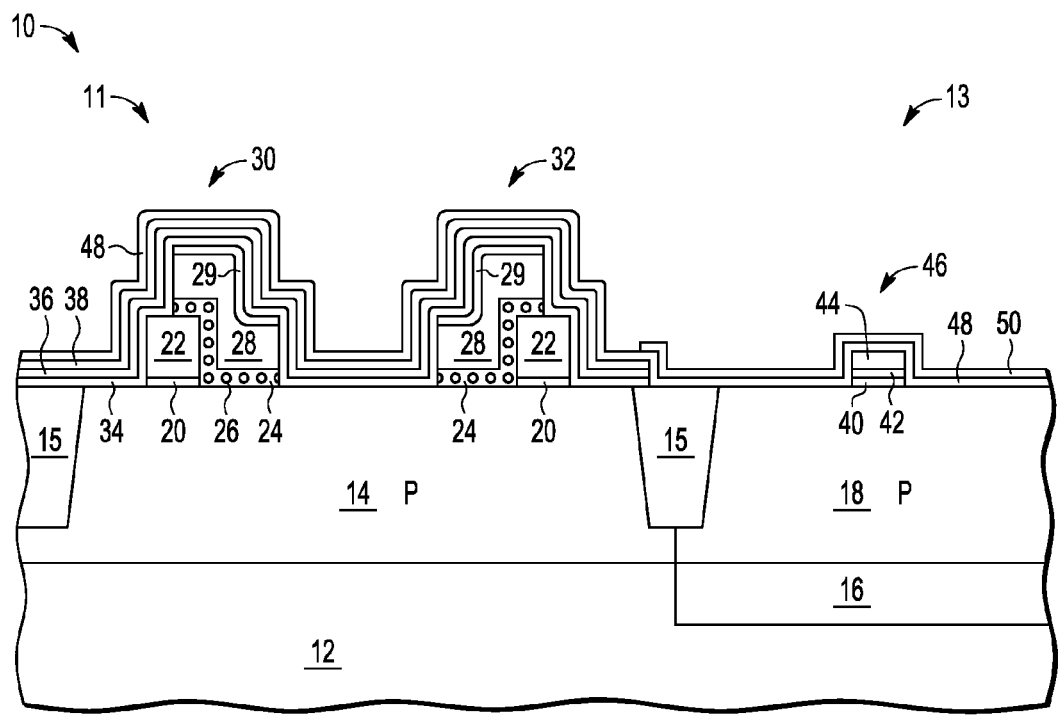
FIG. 14 is a cross section of the semiconductor structure of FIG. 13 at a subsequent stage in processing.

Shown in FIG. 14 is semiconductor structure 10 after a selective etch of oxide layer 50 to remove oxide layer 50 from NVM portion 11 and leave it in logic portion 13.

Figure 15:
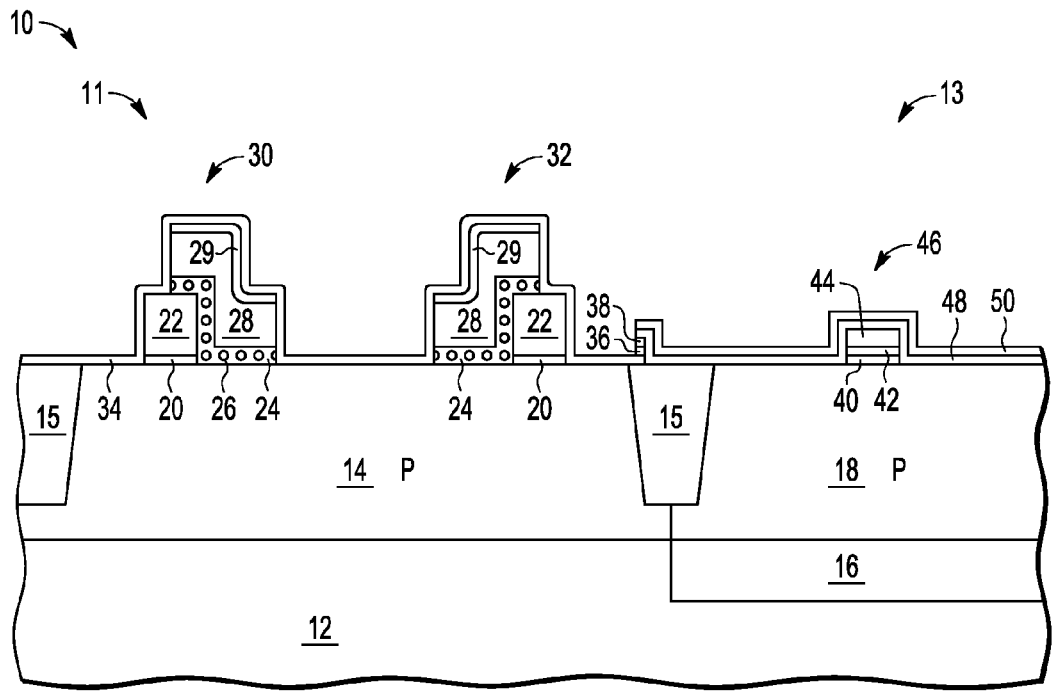
FIG. 15 is a cross section of the semiconductor structure of FIG. 14 at a subsequent stage in processing.

Shown in FIG. 15 is semiconductor structure 10 after a selective etch of nitride layers 36 and 48 using oxide layer 50 as a hard mask. Nitride layers 36 and 48 are thus removed from NVM portion 11 and nitride layer 48 is retained in logic portion 13. The use of oxide layer 50 as a hard mask allows for this selective etch of oxide layer 50 to be achieved without requiring a mask step using photoresist.

Figure 16:
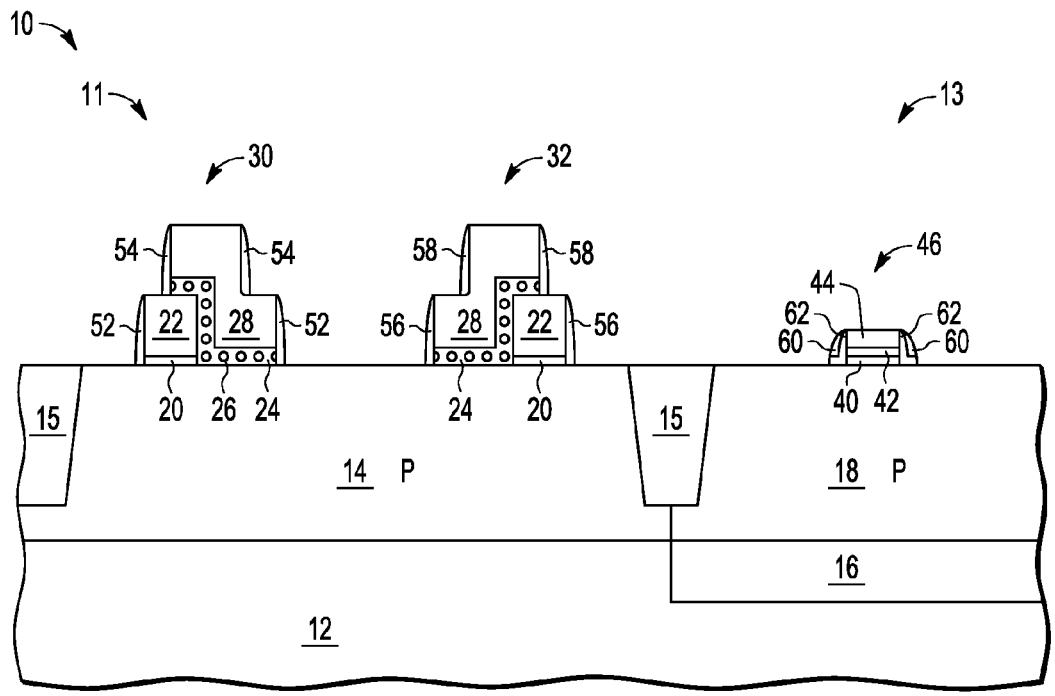
FIG. 16 is a cross section of the semiconductor structure of FIG. 15 at a subsequent stage in processing.

Shown in FIG. 16 is semiconductor structure 10 after performing an anisotropic etch of oxide and a subsequent nitride etch that results in oxide layer 34 becoming sidewall spacers 52, 54, 56, and 58, oxide layer 50 becoming sidewall spacers 60, and nitride layer 48 becoming a sidewall spacer 62. Sidewall spacer 52 is around a lower portion of NVM gate structure 30 so is adjacent to the select gate on one side and the control gate on the other side, sidewall spacer 54 surrounds an upper portion of the NVM gate structure 30 so is adjacent to an upper portion of the control gate, sidewall spacer 56 is around a lower portion of NVM gate structure 32 so is adjacent to the select gate on one side and the control gate on the other side, sidewall spacer 58 surrounds an upper portion of the NVM gate structure 32 so is adjacent to an upper portion of the control gate, and sidewall spacer 60 is around logic gate structure 46. The etch of nitride layer 48 removes nitride layer 48 from over substrate 12 and over the horizontal top surface of logic gate structure 46. The result is a sidewall spacer 62 of nitride around logic gate structure 46 that may also be called a liner under sidewall spacer 60.

Figure 17:
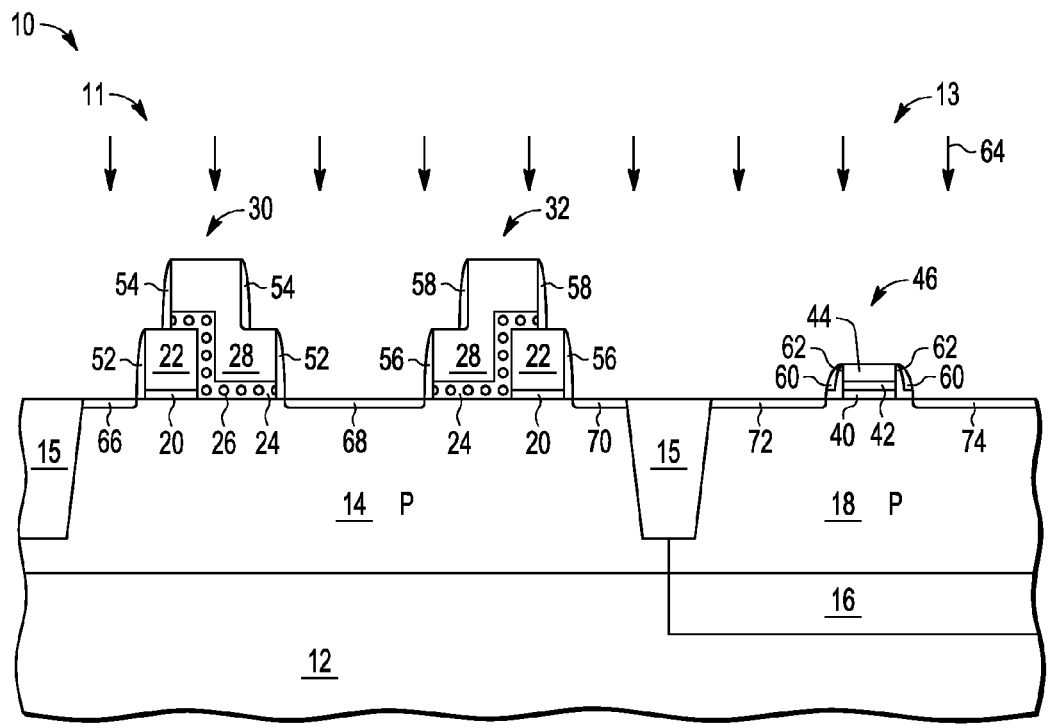
FIG. 17 is a cross section of the semiconductor structure of FIG. 16 at a subsequent stage in processing.

Shown in FIG. 17 is semiconductor structure 10 receiving a source/drain implant 64 that forms source/drain regions 66, 68 and 70 in NVM portion 11 and source/drain regions 72 and 74 in logic portion in substrate 12. In particular source/drain region 66 is in well 14 nearly aligned to the select gate of NVM gate structure 30, source/drain region 68 is in P well 14 nearly aligned to the control gates of NVM gate structures 30 and 32, and source/drain region 70 is in P well 14 and nearly aligned to the select gate of NVM gate structure 32. Implant is 64 forms the source/drain regions that, after processing is complete, define channel length. Source/drain regions 72 and 74 are nearly aligned to opposing sides of logic gate structure 46. The presence of sidewall spacer 62 results in source/drain regions 72 and 74 are further from being aligned to the sides of logic gate structure 46 than source/drain regions 66, 68, and 70 are from being aligned to the select gates and control gates of NVM gate structures 30 and 32. The source/drain regions shown are N type.

Figure 18:
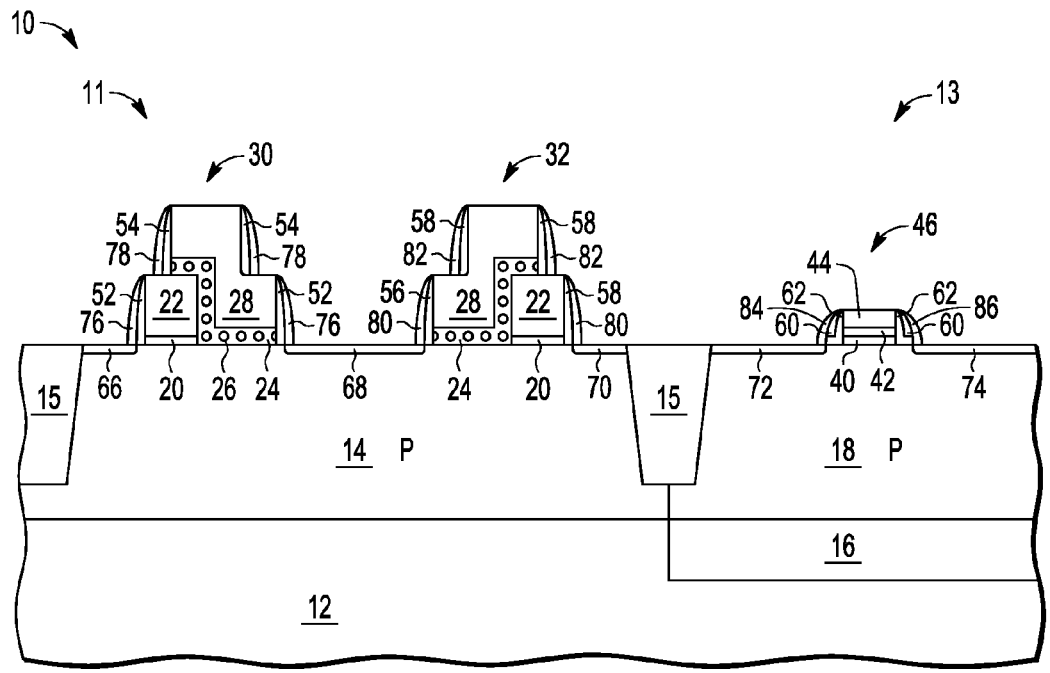
FIG. 18 is a cross section of the semiconductor structure of FIG. 17 at a subsequent stage in processing.

Shown in FIG. 18 is semiconductor structure 10 after forming sidewall spacers 76, 78, 80, 82, and 84 of oxide around sidewall spacers 52, 54, 56, 58, and 60, respectively.

Figure 19:
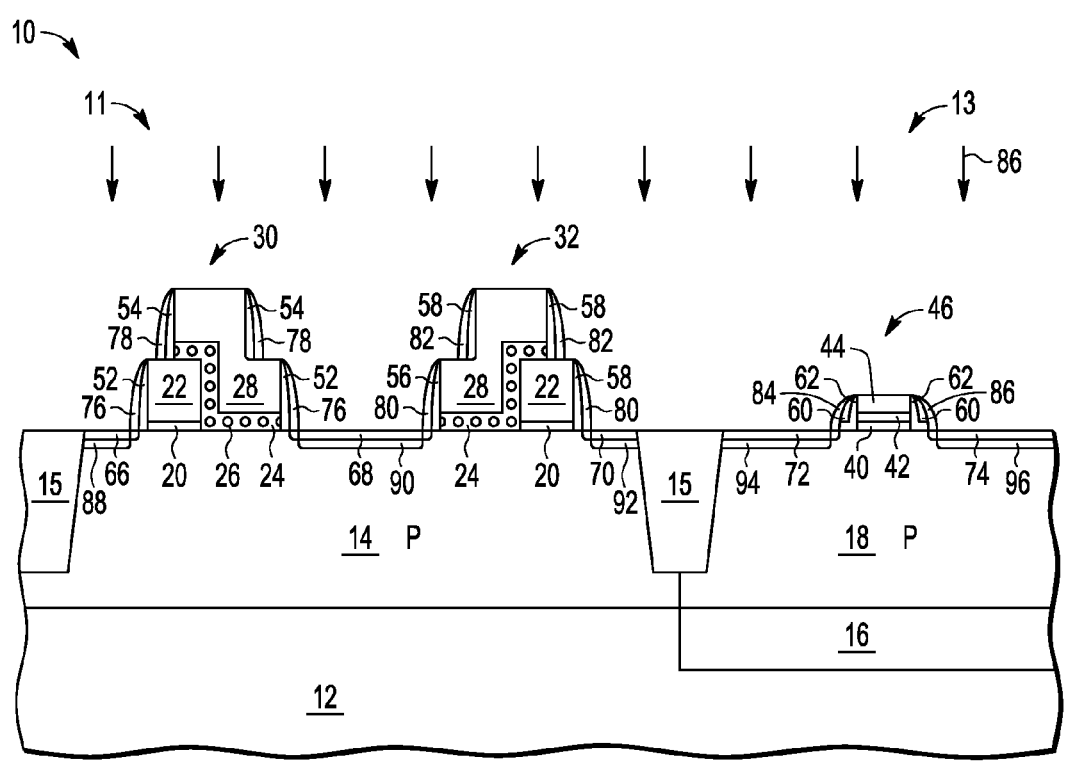
FIG. 19 is a cross section of the semiconductor structure of FIG. 18 at a subsequent stage in processing.

Shown in FIG. 19 is semiconductor structure 10 receiving an implant 86 that is further spaced from gate edges due to sidewall spacers 76, 78, 80, 82, and 84 that results in more heavily doped source/drain regions 88, 90, 92, 94, 96, and 98 which are somewhat deeper and result in portions of source/drain regions 66, 68, 70, 72, and 74, respectively, having higher doping concentrations thus having higher conductivity. This completes the steps for formation of the NVM cells and the logic transistor. These more heavily doped regions are then preferably silicided for making low resistance contacts. Subsequent processing will cause the source/drains as implanted to expand.

Thus it is shown that metal gate transistors can be made in the presence of NVM cells, even if the NVM cells use nanocrystals, and further that the hard mask used during the metal etch can also subsequently be used in forming sidewall spacers used as an implant mask.

By now it should be appreciated that there has been provided a method of making a semiconductor device. The method includes depositing protective layers over a non-volatile memory gate structure on a memory region of a substrate, wherein the protective layers include a first oxide layer, a nitride layer over the first oxide layer, and a second oxide layer over the nitride layer. The method further includes depositing a high-k dielectric layer over the protective layers and over a logic region of the substrate. The method further includes depositing a metal gate layer over the high-k dielectric layer in the memory and logic regions. The method further includes depositing a first polysilicon layer over the metal gate layer in the memory and logic regions. The method further includes patterning and etching the memory and logic regions to form a logic gate in the logic region to remove the protective layers in the logic region, wherein the protective layers remain in the memory region after the etching. The method further includes depositing a first layer of spacer material over the memory and logic regions. The method further includes removing the first layer of spacer material, the nitride layer and the second oxide layer from the memory region. The method further includes etching the first oxide layer along with the first layer of spacer material to form first spacers on the non-volatile memory gate structure and the logic gate. The method may further include forming the non-volatile memory gate structure including forming a select gate, forming a charge storage layer over the select gate in the memory region and over the logic region, depositing a second polysilicon layer over the charge storage layer. The method may have a further characterization by which etching the second polysilicon layer to form a control gate over a portion of a top and sidewall of the select gate, and removing the charge storage layer from areas of the memory region that do not underlie the control gate and from the logic region. The method may have a further characterization by which the charge storage layer includes nanocrystals between layers of dielectric material. The method may have a further characterization by which the second polysilicon layer is deposited in the memory region and the logic region. The method may have a further characterization by which the second polysilicon layer remains in the logic region until after the protective layers are deposited. The method may further include after forming the first spacers, creating halo implants in the substrate for the non-volatile memory gate structure and the logic gate. The method may further include, after forming the halo implants, forming second spacers on the first spacers of the non-volatile memory gate structure and the logic gate, forming source and drain regions for the logic gate and non-volatile memory gate structure, and forming self-aligned silicide regions on exposed portions of the source and drain regions. The method may further include depositing the protective layers in the logic region along with the memory region and removing the protective layers from the logic region before depositing the high-k dielectric layer over the logic region and the memory region.

Also described is a method of making a semiconductor device including forming a split gate memory gate structure on a memory region of a substrate. The method further includes protecting the split gate memory gate structure by depositing protective layers over the memory region including the memory gate structure and over a logic region of the substrate, wherein the protective layers include a material that creates a barrier to diffusion of metal. The method further includes retaining the protective layers over the memory region while forming a logic gate in the logic region, the logic gate includes a high-k dielectric layer and a metal layer. The method further includes depositing spacer material over the logic gate. The method further includes forming spacers on the memory gate structure and the logic gate, wherein the spacer on the logic gate is formed of the spacer material and the spacer on the memory gate structure is formed with one of the protective layers. The method may have a further characterization by which depositing the protective layers includes depositing the protective layers over the logic region along with the depositing the protective layers over the memory region. The method may have a further characterization by which the protective layers include a first oxide layer, the material that creates a barrier to diffusion of metal, and a second oxide layer, and the first oxide layer is used to form one of the spacers on the memory gate structure. The method may have a further characterization by which the forming the split gate memory gate structure includes forming a select gate, forming a charge storage layer over the select gate including depositing a bottom dielectric layer over the select gate, depositing nanocrystals over the bottom dielectric layer, and depositing a top dielectric layer over the nanocrystals, and forming a control gate over the charge storage layer. The method may have a further characterization by which the forming the control gate includes depositing a polysilicon layer over the memory region and the logic region and etching the polysilicon layer in the memory region while retaining the polysilicon layer in the logic region. The method may further include depositing the protective layers over the polysilicon layer in the logic region and removing the protective layers and the polysilicon layer in the logic region before forming the logic gate. The method may further include, before forming the spacers, depositing the spacer material over the protective layers in the memory region and the logic region while depositing the spacer material over the logic gate, depositing photoresist over the logic region, and in the memory region, removing the spacer material and at least the material that creates a barrier to diffusion of metal. The method may further include, after forming the spacers, simultaneously creating halo implants in the substrate for the non-volatile memory gate structure and the logic gate. The method may further include, after forming the halo implants, forming second spacers on the spacers of the non-volatile memory gate structure and the logic gate, simultaneously forming source and drain regions for the logic gate and non-volatile memory gate structure, and simultaneously forming self-aligned silicide regions on exposed portions of the source and drain regions.

Described also is a method of making a semiconductor device including forming a non-volatile memory gate structure in a memory region of a substrate. The forming the memory gate structure includes depositing polysilicon over the memory region and a logic region of the substrate, masking the polysilicon in the logic region and in portions of the memory region, and etching unmasked portions of the polysilicon to form a control gate of the memory gate structure. The method further includes depositing a first spacer material over the memory region and the logic region. The method further includes depositing a metal diffusion barrier layer over the first spacer material in the memory region and the logic region. The method further includes removing the first spacer material and the metal diffusion barrier layer from the logic region. The method further includes depositing a metal layer in the logic region and over the metal diffusion barrier layer in the memory region. The method further includes forming a metal gate from the metal layer in the logic region including removing the metal layer from the memory region. The method further includes forming a second spacer material in the logic region. The method further includes removing the metal layer and the metal diffusion barrier layer from the memory region. The method further includes etching the first spacer material to form a spacer on the memory gate structure while etching the second spacer material for form a spacer on the metal gate. The method may further include depositing a high-k dielectric layer in the logic region and the memory region before depositing the metal layer and removing the high-k dielectric layer in the memory region after removing the metal layer from the memory region. The method may have a further characterization by which, before depositing the polysilicon, forming a select gate and forming a charge storage layer over the select gate, wherein the forming the charge storage layer includes depositing a bottom dielectric layer over the select gate, depositing nanocrystals over the bottom dielectric layer, and depositing a top dielectric layer over the nanocrystals.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials than those described may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device comprising:
    depositing protective layers over a non-volatile memory gate structure on a memory region of a substrate, wherein the protective layers include a first oxide layer, a nitride layer over the first oxide layer, and a second oxide layer over the nitride layer;
    depositing a high-k dielectric layer over the protective layers and over a logic region of the substrate;
    depositing a metal gate layer over the high-k dielectric layer in the memory and logic regions;
    depositing a first polysilicon layer over the metal gate layer in the memory and logic regions;
    patterning and etching the memory and logic regions to form a logic gate in the logic region to remove the protective layers in the logic region, wherein the protective layers remain in the memory region after the etching;
    depositing a first layer of spacer material over the memory and logic regions;
    removing the first layer of spacer material, the nitride layer and the second oxide layer from the memory region; and
    etching the first oxide layer along with the first layer of spacer material to form first spacers on the non-volatile memory gate structure and the logic gate.

2. The method of claim 1 further comprising:
    forming the non-volatile memory gate structure including:
        forming a select gate;
        forming a charge storage layer over the select gate in the memory region and over the logic region;
        depositing a second polysilicon layer over the charge storage layer;
        etching the second polysilicon layer to form a control gate over a portion of a top and sidewall of the select gate; and
        removing the charge storage layer from areas of the memory region that do not underlie the control gate and from the logic region.

3. The method of claim 2 wherein the charge storage layer includes nanocrystals between layers of dielectric material.

4. The method of claim 2 wherein the second polysilicon layer is deposited in the memory region and the logic region.

5. The method of claim 2 wherein the second polysilicon layer remains in the logic region until after the protective layers are deposited.

6. The method of claim 1 further comprising:
    after forming the first spacers, creating halo implants in the substrate for the non-volatile memory gate structure and the logic gate.

7. The method of claim 6 further comprising:
    after forming the halo implants,
        forming second spacers on the first spacers of the non-volatile memory gate structure and the logic gate;
        forming source and drain regions for the logic gate and non-volatile memory gate structure; and
        forming self-aligned silicide regions on exposed portions of the source and drain regions.

8. The method of claim 1 further comprising:
    depositing the protective layers in the logic region along with the memory region; and
    removing the protective layers from the logic region before depositing the high-k dielectric layer over the logic region and the memory region.

9. A method of making a semiconductor device comprising:
    forming a split gate memory gate structure on a memory region of a substrate;
    protecting the split gate memory gate structure by depositing protective layers over the memory region including the split gate memory gate structure and over a logic region of the substrate, wherein the protective layers include a material that creates a barrier to diffusion of metal;
    retaining the protective layers over the memory region while forming a logic gate in the logic region, the logic gate includes a high-k dielectric layer and a metal layer;
    depositing spacer material over the logic gate; and
    forming a spacers on the split gate memory gate structure and a spacer on the logic gate, wherein the spacer on the logic gate is formed of the spacer material and the spacer on the split gate memory structure is formed with one of the protective layers.

10. The method of claim 9 wherein depositing the protective layers includes depositing the protective layers over the logic region along with the depositing the protective layers over the memory region.

11. The method of claim 9 wherein the protective layers include a first oxide layer, the material that creates a barrier to diffusion of metal, and a second oxide layer, and the first oxide layer is used to form one of the spacers on the split gate memory gate structure.

12. The method of claim 9 wherein the forming the split gate memory gate structure comprises:
 forming a select gate;
 forming a charge storage layer over the select gate including:
  depositing a bottom dielectric layer over the select gate;
  depositing nanocrystals over the bottom dielectric layer; and
  depositing a top dielectric layer over the nanocrystals; and
 forming a control gate over the charge storage layer.

13. The method of claim 12 wherein the forming the control gate comprises:
 depositing a polysilicon layer over the memory region and the logic region and etching the polysilicon layer in the memory region while retaining the polysilicon layer in the logic region.

14. The method of claim 13 further comprising:
 depositing the protective layers over the polysilicon layer in the logic region; and
 removing the protective layers and the polysilicon layer in the logic region before forming the logic gate.

15. The method of claim 9 further comprising:
 before forming the spacers:
  depositing the spacer material over the protective layers in the memory region and the logic region while depositing the spacer material over the logic gate;
  depositing photoresist over the logic region; and
  in the memory region, removing the spacer material and at least the material that creates a barrier to diffusion of metal.

16. The method of claim 9 further comprising:
 after forming the spacers, simultaneously creating halo implants in the substrate for the split gate memory gate structure and the logic gate.

17. The method of claim 16 further comprising:
 after forming the halo implants,
  forming second spacers on the spacers of the split gate memory gate structure and the logic gate;
  simultaneously forming source and drain regions for the logic gate and the split gate memory gate structure; and
  simultaneously forming self-aligned silicide regions on exposed portions of the source and drain regions.

18. A method of making a semiconductor device comprising:
 forming a non-volatile memory gate structure in a memory region of a substrate, wherein forming the memory gate structure includes:
  depositing polysilicon over the memory region and a logic region of the substrate;
  masking the polysilicon in the logic region and in portions of the memory region;
  etching unmasked portions of the polysilicon to form a control gate of the non-volatile memory gate structure;
 depositing a first spacer material over the memory region and the logic region;
 depositing a metal diffusion barrier layer over the first spacer material in the memory region and the logic region;
 masking the memory region;
 removing the first spacer material and the metal diffusion barrier layer from the logic region;
 removing the masking from the memory region while retaining the first spacer material and the metal diffusion barrier layer in the memory region;
 depositing a metal layer in the logic region and over the metal diffusion barrier layer in the memory region;
 forming a metal gate from the metal layer in the logic region including removing the metal layer from the memory region; and
 depositing a second spacer material in the logic region;
 removing the metal layer and the protective layers in the memory region; and
 etching the first spacer material to form a spacer on the non-volatile memory gate structure while etching the second spacer material for form a spacer on the metal gate.

19. The method of claim 18 further comprising:
 depositing a high-k dielectric layer in the logic region and the memory region before depositing the metal layer; and
 removing the high-k dielectric layer in the memory region while removing the metal layer and the protective layers in the memory region.

20. The method of claim 18 wherein the forming the non-volatile memory gate structure comprises:
 before depositing the polysilicon,
  forming a select gate; and
  forming a charge storage layer over the select gate including:
   depositing a bottom dielectric layer over the select gate;
   depositing nanocrystals over the bottom dielectric layer; and
   depositing a top dielectric layer over the nanocrystals.

* * * * *